United States Patent
Batson et al.

(10) Patent No.: US 6,687,144 B2
(45) Date of Patent: Feb. 3, 2004

(54) HIGH RELIABILITY CONTENT-ADDRESSABLE MEMORY USING SHADOW CONTENT-ADDRESSABLE MEMORY

(75) Inventors: Kevin A. Batson, Williston, VT (US); Geordie M Braceras, Essex Junction, VT (US); Robert E. Busch, Essex Junction, VT (US); Gary S. Koch, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/430,671

(22) Filed: May 6, 2003

(65) Prior Publication Data

US 2003/0202371 A1 Oct. 30, 2003

Related U.S. Application Data

(62) Division of application No. 10/059,863, filed on Jan. 30, 2002.

(51) Int. Cl.[7] .................................................. G11C 15/00
(52) U.S. Cl. ......................................... 365/49; 365/154
(58) Field of Search ..................... 365/49, 154, 189.07, 365/189.08; 71/108

(56) References Cited

U.S. PATENT DOCUMENTS

| | | | |
|---|---|---|---|
| 3,789,204 A | 1/1974 | Barlow | |
| 4,692,900 A | 9/1987 | Ooami et al. | |
| 5,034,919 A | 7/1991 | Sasai et al. | |
| 5,568,434 A | 10/1996 | Jeon | |
| 5,574,883 A | * 11/1996 | Freeman | 711/119 |
| 5,717,885 A | * 2/1998 | Kumar et al. | 711/207 |
| 5,812,469 A | 9/1998 | Nadeau-Dostie et al. | |
| 5,912,836 A | 6/1999 | Liu et al. | |
| 5,918,047 A | 6/1999 | Leavitt et al. | |
| 6,046,946 A | 4/2000 | Nadeau-Dostie et al. | |
| 6,175,514 B1 | * 1/2001 | Henderson et al. | 365/49 |
| 6,362,993 B1 | * 3/2002 | Henderson et al. | 365/49 |
| 6,373,739 B1 | * 4/2002 | Lien et al. | 365/49 |

* cited by examiner

*Primary Examiner*—Anh Phung
(74) *Attorney, Agent, or Firm*—Schmeiser, Olsen & Watts; Steven Capella

(57) ABSTRACT

A high-reliability content & addressable memory using a shadow content-addressable memory (CAM) array in parallel with a primary CAM array to increase the reliability of CAM searches. The reliability of CAM searches has been less than desired because of random environmental influences that corrupt data. The shadow CAM is written, read, and searched in parallel with the primary CAM. The search results from the parallel searches are compared and, if identical, are declared valid. If the search results are not equal, corrective action is initiated. The high-reliability content-addressable memory may be used with or without priority encoders.

2 Claims, 4 Drawing Sheets

HIGH RELIABILITY CONTENT-ADDRESSABLE MEMORY USING SHADOW CONTENT-ADDRESSABLE MEMORY

This application is a divisional of Ser. No. 10/059,863; filed on Jan. 30, 2002, is still pending.

BACKGROUND OF THE INVENTION

1. Technical Field

This invention relates generally to methods for improving the reliability of content-addressable memory (CAM) using shadow CAM. It also relates more specifically to improving the reliability of high-speed telecommunications switching systems, routers, and databases. Reliability is improved by providing a second array of CAM, referred to as shadow CAM, and writing, reading, and searching both the primary CAM and the shadow CAM in parallel. The results of parallel searches of the primary and shadow CAMs are compared to see if they are identical. If the results are identical, then the search result is declared valid. Otherwise, corrective action is initiated.

2. Background

When searching computer memory, the item searched for is referred to as a comparand. The comparand may be data or the address for some data. Computer memory is searched using a comparand to which values in memory are compared as the search progresses. Content-addressable memory (CAM) is memory which, when searched with a comparand consisting of data, returns the address in CAM, if any, where the data of the comparand can be found. CAM is associative, so addresses of segments of data may also be found. CAM is distinct from traditional random access memory (RAM). RAM is searched for a comparand that is an address and the search returns the data found at that address. CAM is a hardware implementation requiring no software.

CAM is searched for a comparand that is data and CAM returns an address of that data. More precisely, the CAM search returns information about the physical location (herein after "physical address") of the data in the CAM. A device called a priority encoder, often integrated with the CAM, translates that physical address into a logical address for use by a computer. A priority encoder is needed primarily because a CAM search may return more than one result when memory contains more than one copy of the data. The priority encoder determines which of these multiple results has priority. Priority encoders may have additional capabilities, as will be discussed below.

CAM is designed to be searched in parallel: the comparand is compared to the data at every address simultaneously. Because a search of CAM does not read or write the data at the searched-for address, and because the search is a parallel search, CAM searches are very fast. This makes CAM ideal for search-intensive applications such as databases, networking, data compression, cache management, telecommunications switches, routers and image processing. CAM technology has been known in the art for over a decade and is shown and described in U.S. Pat. No. 5,034,919 to Sasai (issued Jul. 23, 1991), the disclosure of which is hereby incorporated herein by reference.

The disadvantage of a CAM search is that, because the data is not read or written during the search, some errors go undetected and uncorrected. For example, if the comparand does not match any data written into the CAM, but corrupted data in the CAM does match the comparand, the search will return the address of the corrupted data. For a further example, if data otherwise matching the comparand has been corrupted, the search will return no address. Data corruption in memory can occur as a result of environmental factors. For example, cosmic rays can cause bits in memory to change state, thereby corrupting the data those bits represent. This problem is particularly troublesome for satellite applications. Electrostatic discharge can also corrupt data. The environmental factors are random. For applications requiring very high reliability, conventional CAM technologies present difficulties.

SUMMARY OF THE INVENTION

The present invention uses shadow CAM to improve the reliability of searching CAM. The shadow CAM is a duplicate of the primary CAM and is read, written, and searched identically to and in parallel with the primary CAM. After a search is executed, the search results for the primary and shadow CAM are compared. It is unlikely that random environmental influences would corrupt data in the same place on each of two CAM arrays. If the search results are identical, then there is a high likelihood that the data is not corrupted. If the search results are not identical, then some data is corrupted, and corrective action can be initiated.

BRIEF DESCRIPTION OF THE DRAWINGS

The foregoing and other features and advantages of the invention will be apparent from the following more particular description of specific embodiments of the invention, as illustrated in the accompanying drawing, wherein.

DESCRIPTION OF EMBODIMENTS OF THE INVENTION

Figure 1:
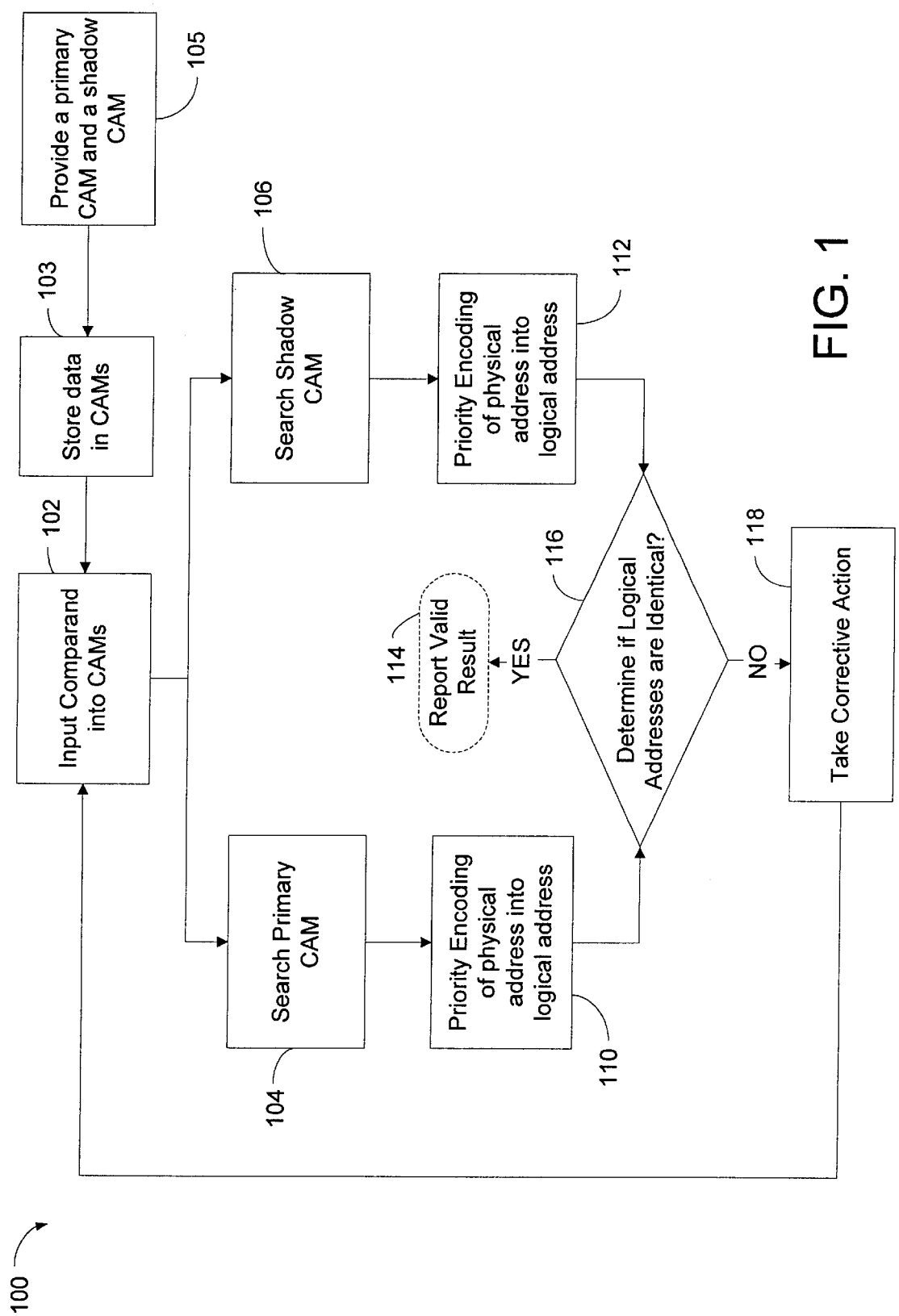
FIG. 1 is a process flow diagram representing an embodiment of the present invention.

The process flow 100 of an embodiment of the invention is illustrated in FIG. 1. The first step is to provide a CAM and a shadow CAM 105. Each CAM has the capability to be written to, read from, searched, and to produce an output from a search. Step 105 includes provision for writing, reading, and searching the primary CAM and the shadow CAM in parallel. By definition, the shadow CAM has an address space with a one-to-one mapping to the address space of the primary CAM. That is, for each address in the primary CAM, there is one unique address in the shadow CAM. In most embodiments, the address space in the shadow CAM has a one-to-one identity mapping to the address space in the primary CAM. Thus, for each address in the primary CAM, there is one identically named address in the shadow CAM. Non-identity mappings are possible, but require extra steps. For example, an offset mapping such as (shadow address=primary address+4) requires the writing, reading, and later, the priority encoding, to calculate the mapping function.

Prior to any search being carried out, data to be searched must be stored 103 in the CAMs. Storage 103 is accomplished by writing the data in parallel into the primary and shadow CAMs. Writing in parallel comprises writing to the same addresses in each CAM. The desired and usual result of the parallel writing is to place the data at an available address in the primary CAM and at the same address in the shadow CAM. Occasionally, the data will be corrupted in one of the CAMs due to environmental influences which change stored data bits or damage the memory. Normally, the storage step places a copy of the input data into an address in the primary CAM and into the same address in the shadow CAM.

The search begins with the input of the comparand into the CAMS 102. The comparand is the data that will be searched for during the search operation. Each CAM has at least one connection for receiving a comparand. In most embodiments, the comparand is provided to the CAMs in parallel. When a CAM receives a comparand comprised of data as its input, it performs a search 104, 106 to see if the data of the comparand is stored within the CAM array and, if the data is found within the CAM array, provide a physical address of the found data as an output. A physical address is an indicator of the physical location of the data in the CAM array. Shadow CAM internal processes are the same as primary CAM internal processes. Note that there are two levels of parallel activity involved in a search. At a first level, the primary and shadow CAMs are being searched 104 and 106 in parallel to each other. At a second level, the memory inside each CAM is being searched for the comparand in a parallel manner. That is, every address within each CAM is searched for the comparand at the same time. When searches 104 and 106 are executed in parallel within the CAMs, identical physical addresses should be returned by the primary and shadow CAMs. For non-identity mappings, the physical addresses will be equivalent rather than identical. Equivalent physical addresses will be translated into identical logical addresses in the priority encoding steps 110 and 112. The physical addresses returned by the searches 104 and 106 may be the highest priority physical addresses containing matching data. In one embodiment, highest priority may mean the physical address nearest a designated end of a CAM array. In another embodiment, highest priority may mean the physical address farthest from that same designated end of a CAM array. Those skilled in the art will appreciate that other priority schemes may be implemented. The physical addresses are regarded as the search results unless priority encoding is used.

It is possible to use only part of a CAM array with its associated read, write, and search processes. For example, if a portion of a CAM array becomes defective, it can be marked invalid, and the remainder of the CAM may still be used. Using a similar method, a user can elect to use a particular portion of a primary CAM and to shadow only that portion with a portion of shadow CAM. In a particular embodiment, at least a portion of the addresses in the primary CAM has a one-to-one mapping to at least an equivalent portion of the addresses in the shadow CAM. The mapping may be an offset or other function.

An offset mapping would equate an address in shadow CAM with the address in primary CAM plus or minus a fixed offset. The reading, writing, and searching steps act in a parallel manner across a non-identity one-to-one mapping. For a variation of this embodiment, compensation for the mapping function takes place in the priority encoding steps 110 and 112. For example, in a non-identity mapping of Shadow physical address=Primary physical address+1, data stored 103 at physical address 0001 (binary) in the primary CAM would also be stored 103 at physical address 0010 (binary) in the shadow CAM. In this example, the writing step 103 takes the mapping into account when writing the data. If the data is ever read from the shadow CAM, the mapping would have to be taken into consideration. When a search is conducted for that data, the comparison of the addresses must again take the mapping into consideration. The mapping may be compensated for during priority encoding 110 and 112 or in a separate dedicated step. In the non-identity mapping example, compensation for the non-identity mapping comprises subtracting one from the shadow physical address. Processes 100 with mappings other than one-to-one identity mapping require more steps than processes 100 with one-to-one identity mappings and so are appropriate in only a limited number of applications where sequential environmental degradations of the CAM arrays are expected to limit system life.

Referring again to FIG. 1, in an embodiment of the invention, priority encoding 110 and 112 is used to translate physical addresses into logical addresses. Logical addresses allow processes outside of the shadow CAM process 100 to refer to the location of the data in the CAMs. For example, logical addresses can be referred to in software. Priority encoding 110 and 112 receives physical addresses as inputs and produces logical addresses as outputs. As discussed above, priority encoding 110 and 112 may include compensating for a non-identity mapping in the translations from physical addresses to logical addresses.

The next step 116 is to determine if the addresses are identical. The comparison 116 may be a bitwise comparison. If the data matching the comparand is uncorrupted, it is most likely that the addresses will be identical. In that case, a valid search result is reported 114. If the addresses are not identical, then some data has been corrupted and corrective action 118 is taken. The corrupted data is not necessarily the data searched for. For example, data on one CAM array at a higher-priority address than the searched-for data may have been corrupted into matching the comparand, rather than data at the correct address being corrupted into not matching the comparand. Given a search result mismatch, corrective action 118 is taken prior to making another search attempt 102. Corrective action 118 may include rewriting data into the CAM arrays or marking at least one of the returned addresses as invalid in both CAM arrays. Note that, for embodiments using a one-to-one identity mapping, an address marked as invalid must be marked invalid in both CAM arrays. Depending on the flexibility of a non-identity mapping in embodiments using such mappings, it may be possible to mark an address as invalid in one CAM and change the address mapping to work around that invalid address. Those skilled in the art will see that a variety of corrective action options may be used. For example, data may be rewritten in larger blocks than the returned addresses would normally address. For a further example, the rewriting strategy may call for rewriting all the data into physical addresses immediately surrounding the physical addresses containing the corrupted data, regardless of the logical addresses, against the possibility that an environmental event has corrupted data within a physical area, rather than just at a logical address.

Figure 2:
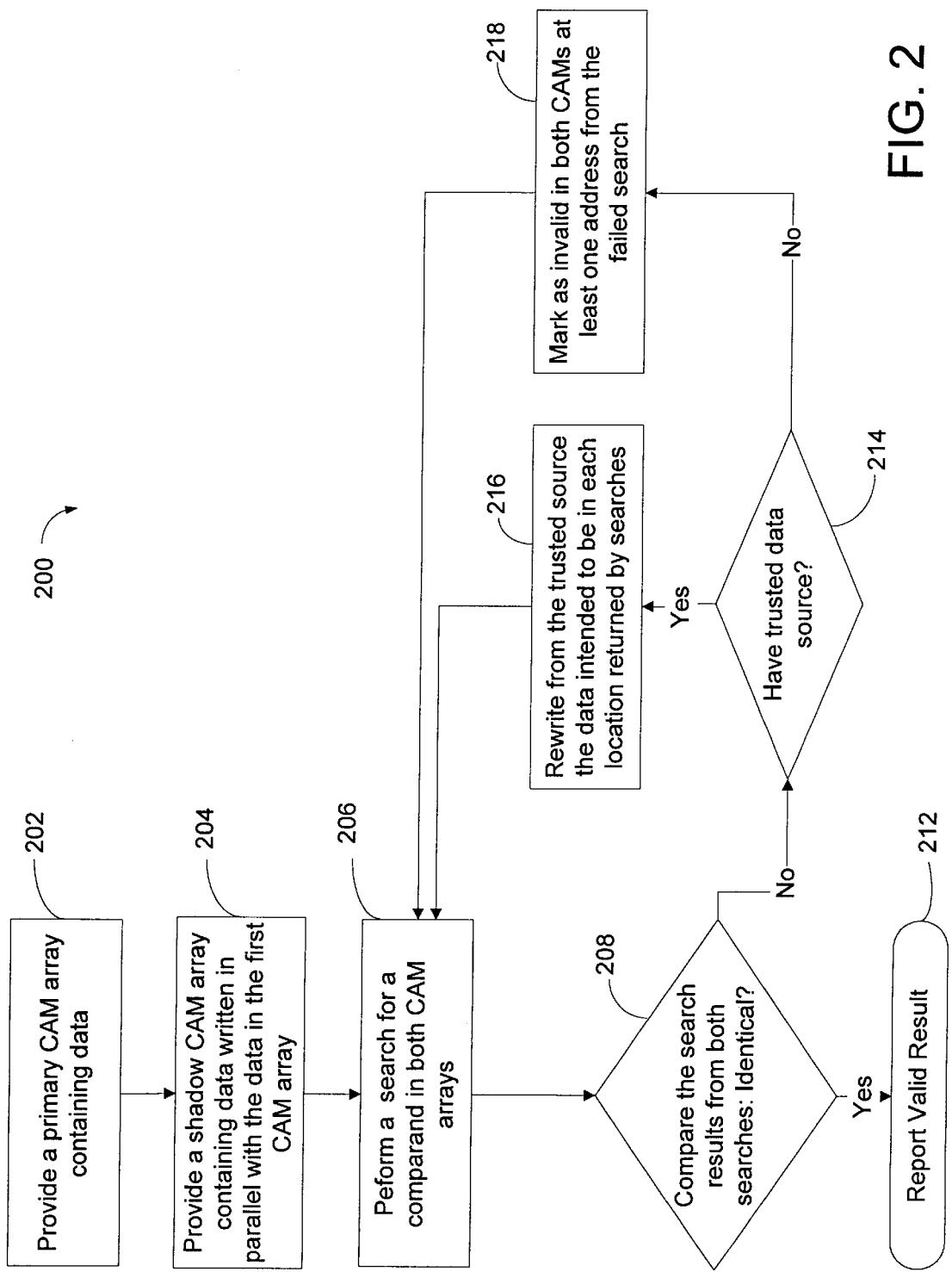
FIG. 2 is a process flow diagram representing another embodiment of the present invention.

In another embodiment of the process, as illustrated in FIG. 2, two corrective action steps 216 and 218 are implemented as alternatives. Such an approach may be appropriate where the trusted data source is a communications channel with limited availability. The process begins with providing the primary CAM array loaded with data to be searched 202. Next, or simultaneously, the shadow CAM array is provided 204, with data written into it in parallel with the data written into the primary CAM array 202. Next, the parallel search 206 is conducted. The results are compared 208 and, if they are identical, a valid result is reported 212. If the results are not identical, the availability of a trusted data source is determined 214. If such a source exists, the data at each of the addresses returned by the search is rewritten from the trusted source 216 into each CAM and the search is repeated 206. Notice that, for a one-to-one identity mapping, the rewrite includes four addresses: each of two addresses in each of two CAMs. If no trusted data source is available, at least one address in each CAM is marked as invalid 218 and the search is repeated 206. Those skilled in the art will see that the mismatch logic, as illustrated, is a potentially infinite loop and those skilled in the art will include known precautions to prevent infinite looping.

Figure 3:
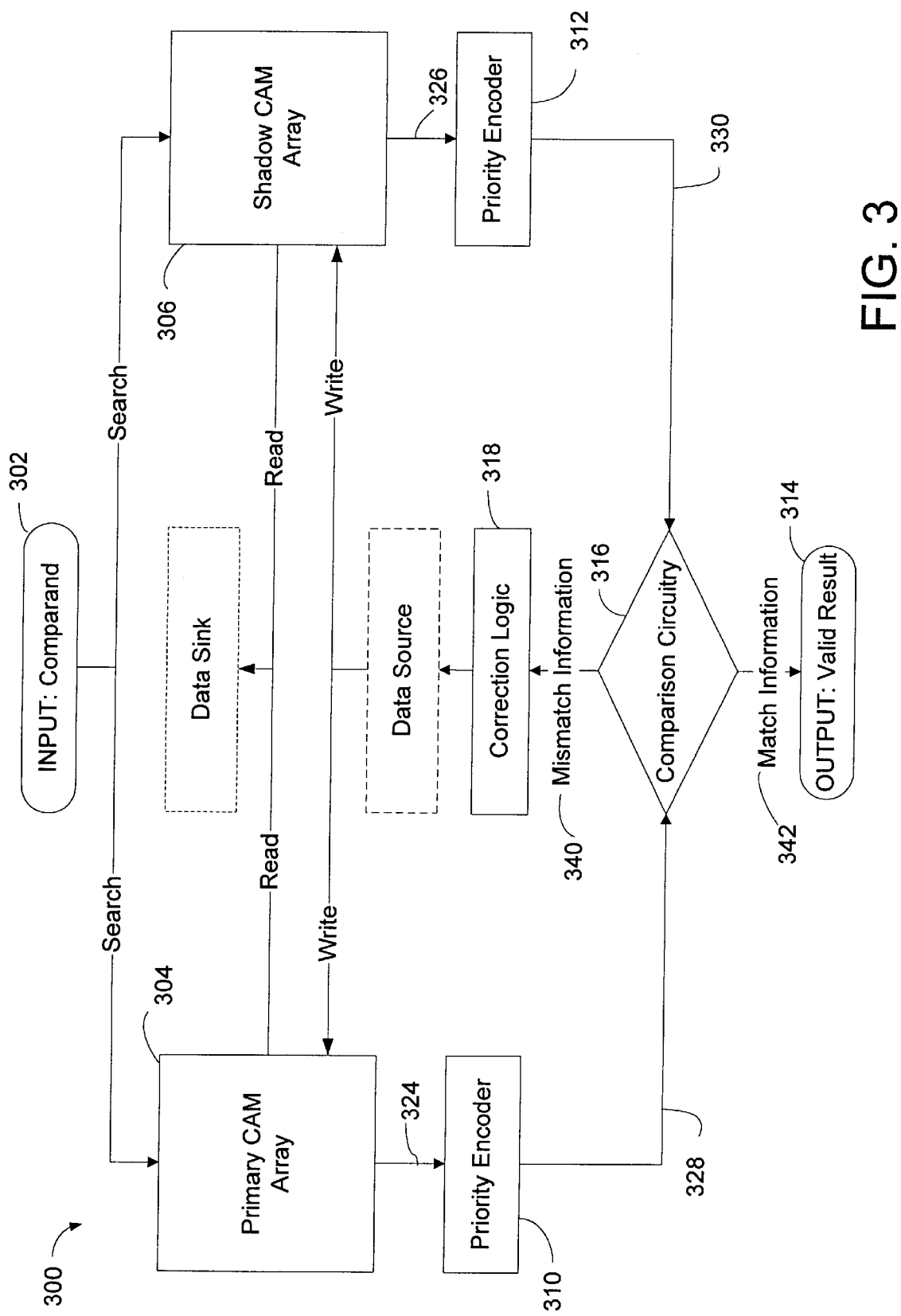
FIG. 3 is a block diagram of an embodiment of the apparatus.

An embodiment of the apparatus is illustrated by block diagram in FIG. 3. Each CAM array 304 and 306 has data connections for writing, reading, and searching. The writing connection is used for storing data in the CAM arrays 304 and 306. For writing, the CAMs are connected to at least one source of data. The connection may be a data bus, as is known in the art, and that data bus may also be connected to a plurality of data sources. The writing connection may also be a direct or integral connection as are known in the art. In the embodiment of FIG. 3, the writing connection comprises a parallel connection configured to write the same data to the same address in each CAM array 304 and 306. In embodiments using non-identity mappings, the writing connection is configured to write the data written in the primary CAM to the equivalent address in the shadow CAM array. The equivalent address is the one designated by the mapping function. In most embodiments, CAM 304 and CAM 306 are written to simultaneously. In practice, "simultaneous" refers to events occurring on the same clock cycle or within a few clock cycles of each other. There is no absolute requirement for simultaneity.

The reading connection is used to allow other components of a computer or system to extract copies of data stored in the CAM arrays 304 and 306. For reading, the CAMs 304 and 306 are connected to a data sink. "Data sink" is a generic term for a component which uses data read from the CAMs 304 and 306. The connection may be a data bus, integral, or direct connection as are known in the art. In the embodiment of FIG. 3, the reading connection comprises a parallel connection which reads (ideally) the same data from the same addresses in each CAM array 304 and 306. In most embodiments, CAM array 304 and CAM array 306 are read simultaneously.

The searching connection is used to input the comparand 302 into the CAM arrays 304 and 306 and initiate the search. The searching connection comprises a parallel connection from the comparand input source to the CAM arrays 304 and 306. The comparand input source is the circuit, component, system or computer using the present invention to store and retrieve data. Once the comparand 302 has been received by the CAM arrays 304 and 306, the search is carried out in a parallel fashion within the CAM array 304 or 306, respectively. In the embodiment shown in FIG. 3, the searching within CAM array 304 and the searching within CAM array 306 take place simultaneously. In practice, "simultaneously" may comprise a difference of a number of clock cycles or may be simultaneous within the accuracy limit of a system clock or oscillator. When the searches are complete, each CAM array 304 and 306 will produce as output the highest priority physical address 324 or 326 of the data stored in each CAM array 304 and 306, which data matches the data in the comparand 302. If the data is uncorrupted, both physical addresses 324 and 326 will be identical or differ only by a predetermined function.

Each CAM array 304 and 306 has an output that may be connected to a priority encoder 310 or 312. The priority encoders 310 and 312 receive the physical addresses 324 and 326 from the CAM arrays 304 or 306 and produce unique logical addresses 328 and 330 to represent the physical addresses 324 and 326, respectively. In embodiments using priority encoders 310 and 312, logical addresses 328 and 330 are referred to collectively as the "search results." In an embodiment, the logical addresses 328 and 330 are the highest priority addresses from their respective searches. In another embodiment, priority encoders 310 and 312 are not used. For example, a shadow CAM device 300 used as a translation look-aside buffer (TLB) may require no priority encoders 310 and 312. In a TLB, the data stored in CAM is itself an address, and the address returned from the CAM 300 corresponds to data in another memory (perhaps RAM). Thus, a TLB can be used to translate between virtual and physical addresses.

The outputs of the priority encoders 310 and 312 are connected to the inputs of the comparison circuitry 316. In an embodiment, when comparison 316 of the search results 328 and 330 does not result in a match 340, corrective action may be initiated. The comparison circuitry 316 has an output connected to the input of the correction logic 318.

In the event of a mismatch of search results 328 and 330, correction logic 318 accepts the mismatched addresses 328 and 330 as input, corrects or avoids the problem, and restarts the search for the comparand 302. For example, data may be rewritten in parallel from a trusted data source into each of the CAM arrays at each of the mismatched physical addresses 324 and 326. Rewriting the correct data into each returned physical address 324 and 326 on each CAM array 304 and 306 solves both the corrupted-into-matching and the corrupted-into-mismatching cases. In another embodiment, a block of data within the CAM arrays 304 or 306 may be associated with each possible address 328 and 330 and the data blocks containing the logical addresses 328 and 330 may be rewritten within each CAM array 304 and 306. In yet another embodiment, corrective action may comprise marking at least one of the mismatched physical addresses 324 and 326 within each of the CAMs 304 and 306 as invalid addresses.

If the comparison circuitry 316 determines that the addresses 328 and 330 are identical 342, then the search results 328 and 330 are reported as valid 314 and the address 328 or 330 is sent to the output of the shadow CAM device 300. In the embodiment of FIG. 3, if no matching data is found in either CAM, the search results 328 and 330 are identical null addresses which produce a valid output 314 showing no data has been found.

Figure 4:
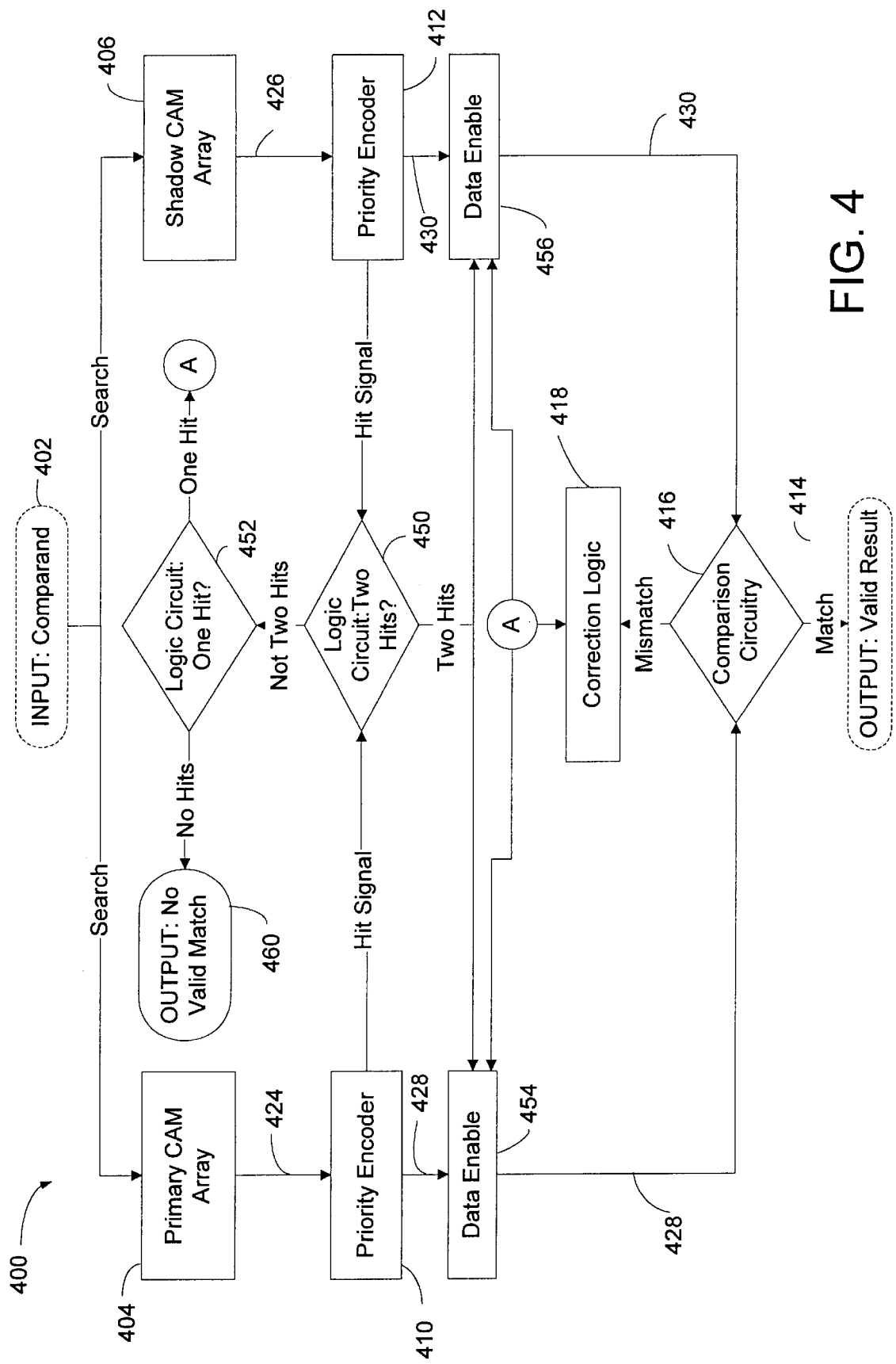
FIG. 4 is a block diagram of another embodiment of the apparatus.

Another embodiment of the apparatus 400 is shown in FIG. 4. FIG. 4 is numbered using the two least significant digits from similar components in FIG. 3. The reading and writing connections have been omitted from the drawing of FIG. 4 but are present in the embodiment. The priority encoders 410 and 412 receive the physical addresses 424 and 426 and additionally generate a signal to indicate whether a match to comparand 402 has been found. The finding of a match to the comparand 402 in the data of the CAM arrays 404 and 406 is referred to as a "hit", and the signal indicating a hit is referred to as the "hit signal." Hit signals may be single bits of data, making their comparison and processing very fast. The circuitry for comparing search results 416 is slower, and need not be used in cases where the search does not produce a hit from each CAM array 404 and 406.

The connections conducting the hit signals from the priority encoders are connected to a logic circuit 450, which can be as simple as an AND gate, which determines if two hits have occurred. The output of the logic circuit 450 is connected to data enable gates 454 and 456. If two hits have occurred, logic circuit 450 outputs a signal to the data enable gates 454 and 456 which allow transfer of the search results 428 and 430 to the comparison circuitry 416. The search results 428 and 430 are conducted into the comparison circuitry 416 which determines if the search results 428 and 430 are identical to each other and then comparison circuitry 416 produces an output depending upon the result of that determination. If the search results 428 and 430 are identical, the search results 428 and 430 are output from the shadow CAM device 400 to the component receiving valid results 414. If not, the search results 428 and 430 are reported to the correction logic 418. If the search does not produce two hit signals, the question remains whether the search produced one hit or no hits. If two hits are not produced, logic circuitry 452 (which may be an OR gate) determines if only one hit occurred. If so, corrective action is initiated by inputting the search results 428 and 430 into the correction logic 418. The search result 428 or 430 can be sent indirectly through the comparison circuit 416 by enabling the data enable gates 454 and 456. Alternatively, the search result 428 or 430 can be sent directly to the correction logic 418. If not even one hit has occurred, then the data of the comparand at the input 402 is simply not in the CAM arrays 404 or 406 and a valid result of no matching data is reported to the component receiving outputs of valid results of no matching data 460. Those skilled in the art aware of a variety of logical circuits that can achieve the results of the apparatus.

The foregoing description has described selected embodiments of a high-reliability content-addressable memory using shadow content-addressable memory.

While the invention has been particularly shown and described with reference to selected embodiments thereof, it will be readily understood by one of ordinary skill in the art that, as limited only by the appended claims, various changes in form and details may be made therein without departing from the spirit and scope of the invention.

We claim:

1. A shadow content-addressable memory apparatus comprising:

a first content-addressable memory and a second content-addressable memory having, respectively, a first array of content-addressable memory and second array of content-addressable memory configured for writing, reading and searching in the first and second arrays in parallel;

comparison circuitry coupled to the first and second CAM and configured to compare a search result from the first array of content-addressable memory with a search result from a second array of content-addressable memory; and circuitry configured to generate an output responsive to the first and second search results to indicate whether the search results are equivalent.

2. The apparatus of claim 1 wherein arrays of content-addressable memory comprise content-addressable memories with address spaces having a non-identity one-to-one mapping to each other.

* * * * *